United States Patent
Dallabetta et al.

(10) Patent No.: US 7,221,180 B2
(45) Date of Patent: May 22, 2007

(54) DEVICE AND METHOD FOR TESTING ELECTRONIC COMPONENTS

(75) Inventors: Hardy Dallabetta, Regensburg (DE); Walter Diez, Regenstauf (DE); Franz Stegerer, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/316,342

(22) Filed: Dec. 23, 2005

(65) Prior Publication Data

US 2006/0132156 A1    Jun. 22, 2006

Related U.S. Application Data

(63) Continuation of application No. PCT/DE04/01146, filed on Jun. 4, 2004.

(30) Foreign Application Priority Data

Jun. 25, 2003  (DE) ................ 103 28 719

(51) Int. Cl.
*G01R 31/28* (2006.01)
*B07C 5/344* (2006.01)

(52) U.S. Cl. ................... 324/765; 209/573

(58) Field of Classification Search .............. None
See application file for complete search history.

(56) References Cited

U.S. PATENT DOCUMENTS

| | | | |
|---|---|---|---|
| 4,985,673 A | 1/1991 | Horie | |
| 5,589,765 A | 12/1996 | Ohmart et al. | |
| 6,043,443 A | 3/2000 | Doran et al. | |
| 6,154,712 A | 11/2000 | Breu et al. | |
| 6,731,127 B2* | 5/2004 | Watts | 324/765 |
| 6,975,028 B1* | 12/2005 | Wayburn et al. | 257/718 |
| 2003/0005376 A1 | 1/2003 | Lee et al. | |

FOREIGN PATENT DOCUMENTS

| | | |
|---|---|---|
| JP | 2000193717 A | 12/1998 |
| JP | 11039180 A | 2/1999 |
| WO | WO 94/18637 | 8/1994 |
| WO | WO 97/05496 | 2/1997 |
| WO | WO 98/03879 A1 | 1/1998 |

\* cited by examiner

*Primary Examiner*—Ernest Karlsen
(74) *Attorney, Agent, or Firm*—Edell, Shapiro & Finnan, LLC

(57) ABSTRACT

A test device includes first and second testers each having at least one testing contact for making contact with at least one external contact of an electronic component; and a conveying device that conveys electronic components to the first and second testers in a synchronized manner such that the external contacts of the electronic components form an electrical connection to the testing contacts. Via the testing contacts, it is possible to apply input voltages and input currents to the electronic components and it is possible to measure the voltages, currents and resistances prevailing in the electronic components. The testers check the electronic components on the basis of a predetermined overall set of test criteria or on the basis of subsets of the overall set of test criteria.

11 Claims, 4 Drawing Sheets

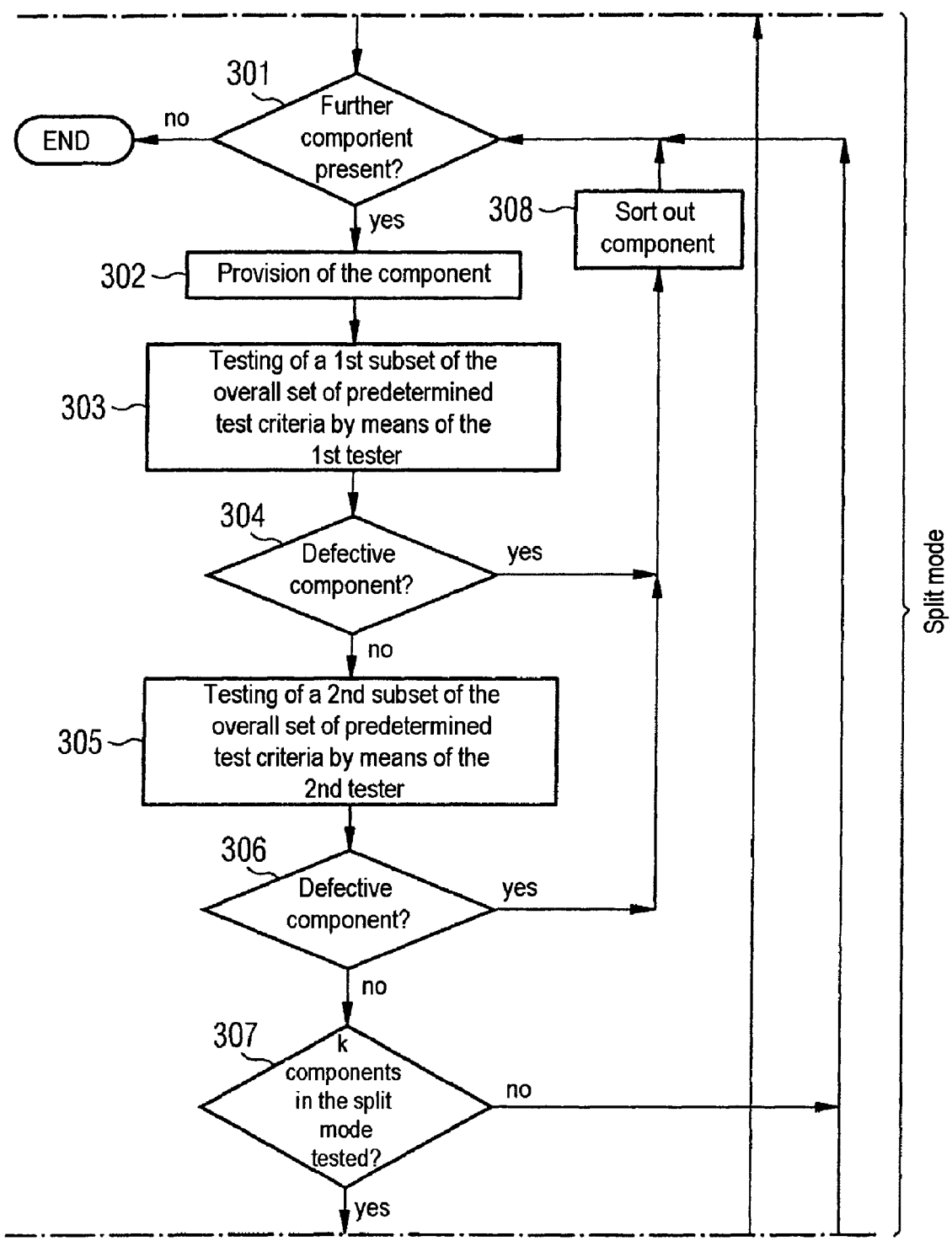

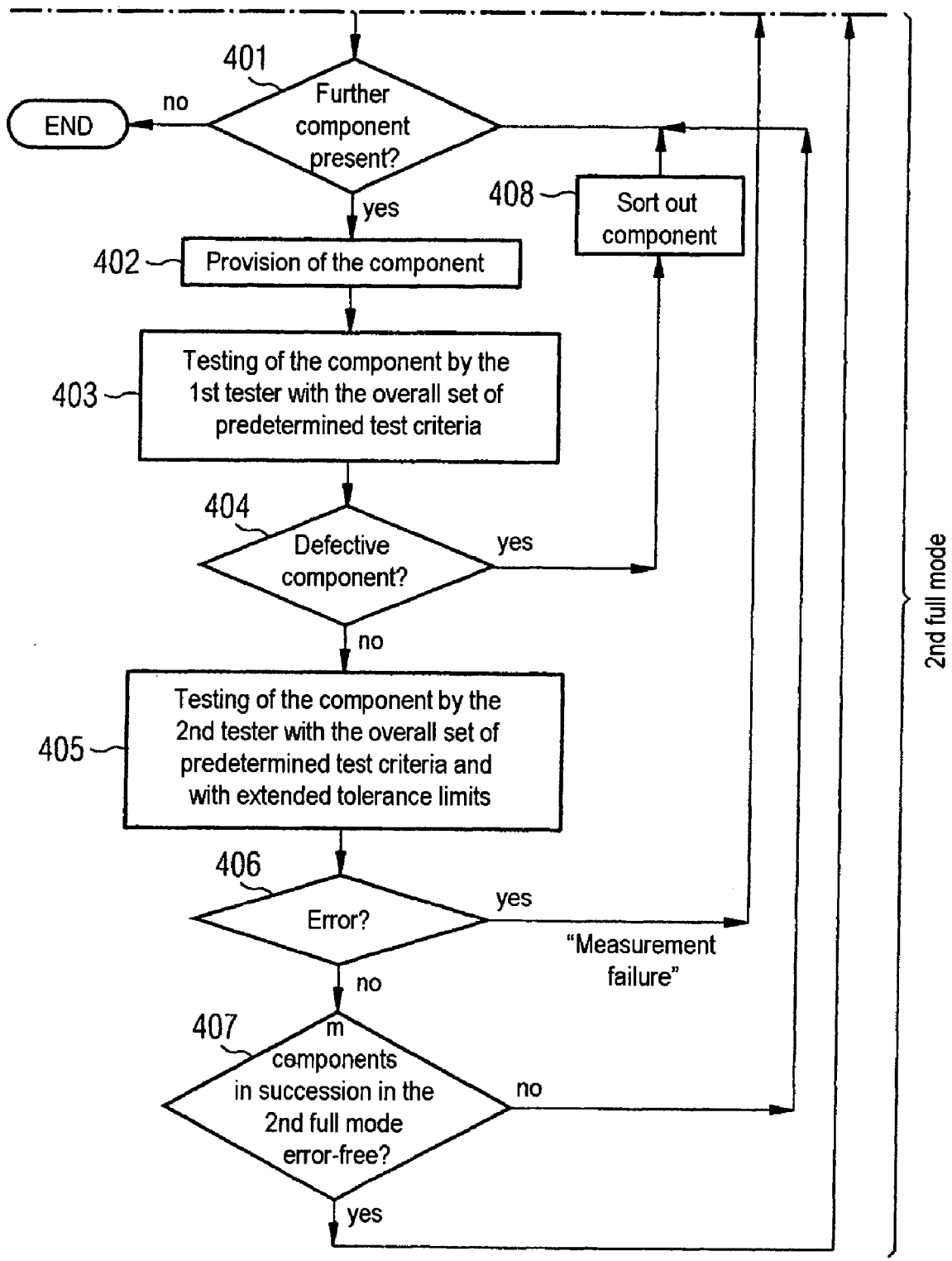

DEVICE AND METHOD FOR TESTING ELECTRONIC COMPONENTS

CROSS REFERENCE TO RELATED APPLICATIONS

This application is a continuation of PCT/DE2004/001146, filed, Jun. 4, 2004, and titled "Device and Method for Testing Electronic Components," which claims priority under 35 U.S.C. §119 to German Application No. DE 10328719.1, filed on Jun. 25, 2003, and titled "Device and Method for Testing electronic Components," the entire contents of which are hereby incorporated by reference.

FIELD OF THE INVENTION

The invention relates to a device and a method for testing electronic components.

BACKGROUND

After the production of electronic components, it is often necessary to subject the components produced to a functional test. For time and cost reasons, it is often not possible in this case to perform a second 100% testing of all the relevant parameters for all the electronic components produced. Rather, for a small number of electronic components of a batch produced, in the context of a random sample, a second 100% measurement is carried out at a manual measuring station.

The measuring instruments or measuring equipment or testers used in this case are often very sensitive. Functional disturbances or failures of such testers are often only identified belatedly during such tests.

SUMMARY

The methods and apparatus of the present invention can be used to reliably and comprehensively test electronic components, and functional disturbances occurring in the testers used can be identified early and reliably.

Specifically, a test device for electronic components according to the invention comprises a first tester and a second tester, each of which has at least one testing contact for making contact with at least one external contact of an electronic component. The test device further includes a conveying device, in particular a conveyer belt, which is formed such that electronic components can be conveyed to the first tester, subsequently to the second tester, and then further in a synchronized manner. The conveyance is effected so precisely to a test position on the top side of the tester that the external contacts of the electronic components form an electrical connection to the testing contacts in this test position. Via the testing contacts, it is possible to apply voltages and currents to the electronic components and to measure the voltages, currents, resistances or other electrical parameters prevailing in the electronic components. The testers can check the electronic components on the basis of an overall set of test criteria predetermined by a user, for example, and on the basis of subsets of the overall set of test criteria.

By virtue of two independent testers being arranged one after the other, it is possible for a plurality of tests, including tests of identical type, for an electronic component to be performed directly one after the other optimally in respect of speed. In this case, the test criteria to be tested can be successively processed in a redundant manner by both testers, thus resulting in a high test reliability. If the test criteria to be tested are divided between the two testers by subsets, then this results in a very fast test without the need to dispense with the testing of test criteria.

A test device of this type can measure electronic components in a synchronized manner inline, i.e., within the production sequence. Reliable statements about the functionality of the electronic components produced are available at the end of the production cycle.

The test criteria may comprise predetermined values for input voltages and/or input currents to be applied to the electronic component, predetermined desired values and tolerance ranges for voltages present in the electronic component, in particular forward voltages and/or currents, in particular reverse currents, and/or resistances, and also defined time intervals. An arbitrary number of individually selectable test criteria can be processed by the testers.

In one embodiment of the test device, there is provided a control device that is connected to the first tester, the second tester, and the conveying device and which controls these. With the aid of the control device, the test device can be adapted to the tests that are respectively to be performed. Test programs to be performed by the first and second testers can be selected and altered. Furthermore, the speed and thus the cycle time of the conveying device can be set precisely to the test programs of the testers that are respectively to be performed.

The invention also relates to a method for testing electronic components. At the beginning of the method, a set of test criteria that are used by the testers for the tests to be performed is defined by a user. Input and output parameters, e.g., voltages, currents and resistances, can be predetermined in a component-specific manner by a user. Intervals can be defined for the output parameters that the electronic component is intended to supply depending on specific defined input parameters. If the output parameters measured by the testers lie within these intervals, then the relevant component has passed the test with regard to this parameter. Otherwise, an error message is produced. Further test criteria are formed, e.g., by the zero error criterion in the second 100% measurement by the second tester and deviations of defined parameters from the first to the second measurement within permitted tolerances.

A set of electronic components of identical type to be tested is then provided. This set of electronic components of identical type may be, in particular, a production batch.

The method according to the invention can be subdivided into a first full mode and into a split mode. At the beginning of the method according to the invention, the first full mode is carried out in each case, in which an electronic component is first selected from the set of electronic components of identical type and is checked by a first tester on the basis of a predetermined set of test criteria. If the first tester finds an error for the electronic component, the electronic component is sorted out, and the method steps of the full mode beginning with the selection of an electronic component are repeated. If no error is found, the selected electronic component is subsequently checked by a second tester on the basis of the same predetermined set of test criteria. If the second tester finds an error for the electronic component, the relevant electronic component is sorted out. If a measurement failure occurs at the second tester in the case of the extended limits, then this is an indication of a measurement problem in the system, since the component was assessed without errors at the first tester. The aforementioned operations of the first full mode are repeated in a looplike manner until no errors have been found at the second tester for a predetermined number of checked components in succession.

The method is then continued in the split mode. In this case, a further electronic component is first selected from the set of electronic components of identical type, which component is then checked by the first tester. This checking is effected on the basis of a first subset of the predetermined set of test criteria. If an error occurs in this case, the electronic component is sorted out. If no error is found, the electronic component is checked by the second tester, with a second subset of the predetermined set of test criteria being used. If an error results in this case, the relevant electronic component is sorted out.

In the first full mode, a 100% measurement is effected twice at the start of the batch, i.e., two complete checks of all the predetermined test criteria. If the defined test criteria are fulfilled, a changeover is made from the full mode to the split mode, in which the overall set of test criteria, which forms the measurement program of the first tester in the full mode, is distributed between the first and second testers.

In this case, the first and second subsets of the test criteria may be determined by a user. It is also possible for the test criteria to be divided between the two testers in an automated manner, e.g., such that the test duration for checking the test criteria of the two subsets approximately matches on the testers.

The test method according to the invention can be used to check a multiplicity of electronic components of almost any desired complexity, e.g., diodes or transistors. Depending on the complexity of the electronic components under consideration, different parameters may be detected and measured by the testers. In the case of complex transistors, it is often necessary to simultaneously measure and check a multiplicity of different parameters. This is possible in a simple manner and optimally in respect of speed with the method according to the invention.

In accordance with a first basic concept of the invention, at the start of the test method according to the invention, a double 100% measurement of the underlying parameters is performed until a sufficient statement can be made about the quality of the entire test system, in particular the testers, the cabling, the connection and the contact-making. The duration of the double 100% measurement may be determined by the user by prescribing the number of error-free electrical measurements which have to be run through in the first full mode in succession before a change is made to the split mode.

In accordance with a second basic concept of the invention, all of the test criteria to be checked are likewise tested in the split mode, the test criteria being distributed as far as possible uniformly between the two testers. This ensures that all the parameters are actually detected and measured. The distribution of the test parameters between the two testers involved results in a significant speed advantage and hence a shortening of the cycle time for the test method.

In accordance with a first embodiment of the method according to the invention, the operations of the first and second full modes or of the split mode are repeated in a looplike manner as often as until all of the electronic components of the batch have been checked. In this case, it is possible to achieve a high error detection rate in conjunction with a short method run duration.

In accordance with one advantageous feature of the invention, the operations of the split mode are repeated in a looplike manner as often as until a predetermined number of electronic components have been checked in the split mode. The performing of a second full mode is provided subsequent to the split mode.

In the second full mode a further electronic component is selected from the set of electronic components of identical type and is checked by the first tester on the basis of the predetermined overall set of test criteria. If an error is detected, the relevant electronic component is sorted out. If the checking of the first tester proceeds without any errors, then the checking of the electronic component by the second tester follows, during which the predetermined overall set of test criteria with extended tolerance limits is likewise tested. If an error occurs in this case, the electronic component is sorted out and a change made back to the first full mode. These operations of the second full mode are repeated in a looplike manner until a predetermined number of error-free electronic components in direct succession have been checked in the second full mode. If a predetermined number of error-free electronic components in succession have been found in the second full mode, then a change is made back to the split mode again.

With regard to the sequence, the second full mode corresponds to the first full mode. In contrast to the first full mode, however, the second full mode is repeated significantly less. In many cases, it is sufficient if the second full mode is performed only with a single repetition and then from the second full mode a changeover is made directly to the split mode again.

A further basic concept of the invention consists in regularly changing over from the split mode to the second full mode. In this case, a user can prescribe the frequency of the changes from the split mode to the second full mode and also the respective length of the second full mode through the choice of the predetermined number of error-free electronic components that are to be checked in the split mode and in the second full mode.

The provision of an additional second full mode ensures a particularly high measurement reliability. By alternately performing the speed-optimal split mode and the particularly reliable full mode, it is possible to achieve a reduction of up to 50% in the measurement and cycle time of the test device or test station without a loss of measurement reliability having to be accepted, e.g., through the deletion of measurement parameters. In this case, the test capacity is increased without a loss of measurement reliability and without additional capital expenditure. The regular interposition of the second full mode likewise ensures that functional disturbances or defects in the first or in the second tester are reliably identified.

The method according to the invention is particularly optimal with respect to speed when the subsets of defined test criteria that are checked on the two testers in the split mode are disjoint, i.e., when no criteria are checked twice.

In one advantageous aspect of the invention, although in the first and in the second full mode the checking of the electronic component by the second tester is effected using the same parameters as directly beforehand by the first tester, this checking is effected with extended tolerance limits. This has the effect that an electronic component that has been found to be error-free in the course of the first tester's check should ideally likewise pass through as error-free in the course of the second tester's check. If this is not the case, then this may be an indication of a functional disturbance or of a defect of the first or second tester.

The test criteria may comprise predetermined values for voltages and/or currents to be applied, predetermined desired values and tolerance ranges for voltages present in the electronic component, in particular forward voltages and/or currents, in particular reverse currents, and/or resistances, and also defined time intervals. A different number of different test criteria may be used depending on components to be tested. In this case, the test criteria may be selected by a user and be programmed into the testers respectively used. The definition and programming of such test criteria into customary testers is known to those skilled in the art and therefore need not be explained in any further detail here.

In accordance with one advantageous aspect of the invention, the first tester and the second tester have testing contacts that are connected to the external contacts of the electronic components tested in an automated manner prior to the checking operations of the method and are disconnected from the external contacts again after the checking operations. In this case, this connection and disconnection may be effected by a conveying device of precision operation, or by a conveyer belt, which places the electronic components with their external contacts precisely onto the testing contacts of the respective tester. The conveying device can move the electronic components to the first tester, to the second tester and further in an automated manner. The provision of such a conveying device enables the method according to the invention to be automated in a particularly advantageous manner. Such an automated test method according to the invention may be used inline, i.e., in the production line of the respective electronic components, as a result of which contemporaneously reliable statements about the quality of the components produced can be made.

The control of the testers and of the conveying device may be effected by a control system connected to the testers and to the conveying device. Depending on the selected test criteria, this control system controls the speed and the cycle of the movement of the conveying device and of the test programs of the testers.

The invention is also realized in a computer program for performing the method for checking electronic components. In this case, the computer program contains program instructions which cause a first tester and a second tester and/or a conveying device and/or a control system connected to the first tester, to the second tester and to a conveying device to perform such a method in an embodiment described above. In this case, the computer program controls the sequence of the testers' checking operations that are to be performed in the context of the first full mode, the split mode and the second full mode, and/or the synchronous, in particular cyclically timed movement of the electronic components toward the testers and away from the testers again. Electronic components of almost any desired complexity can be tested rapidly and comprehensively by the computer program according to the invention.

The invention additionally relates to a computer program that is contained on a storage medium, which is stored in a computer memory, which is contained in a read-only memory or in a ROM memory, or which is transmitted on an electrical carrier signal. The invention also relates to a carrier medium, in particular a data carrier, such as, e.g., a floppy disk, a Zip drive, a streamer, a CD or a DVD, on which a computer program described above is stored. Furthermore, the invention relates to a computer system on which such a computer program is stored. Finally, the invention relates to a method in which such a computer program is downloaded from an electronic data network, such as e.g. from the Internet, onto a computer connected to the data network.

In practical tests, performed with the test handler of design SOT3×3, the following shortenings of the cycle time and thus of the timing period were achieved through the use of the test method according to the invention. Package SOT 323 and package SOT 343 from 240 ms to 220 ms (8%), package SOT 363 S from 280 ms to 220 ms (21%) and package SOT 363 PN from 370 ms to 250 ms (32%). It was evident that particularly great potential savings result for long test intervals. In the case of a test time of less than 90 ms, the dictates of the system meant that it was not possible to achieve a reduction of the timing period.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is illustrated in more detail on the basis of an exemplary embodiment in the figures.

FIGS. 2A–2C show a flow diagram for illustrating the test method according to an exemplary embodiment of the invention.

DETAILED DESCRIPTION

Figure 1:
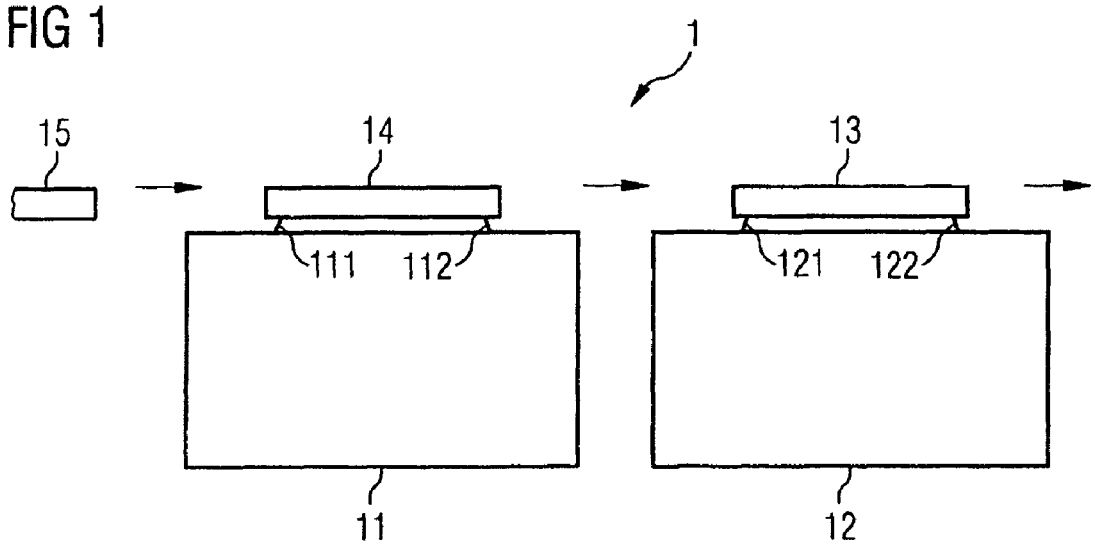
FIG. 1 shows a schematic illustration of a test station with a first tester and with a second tester in accordance with an exemplary embodiment of the invention.

FIG. 1 shows a schematic illustration of a test station 1 with a first tester 11 and with a second tester 12. The first tester 11, arranged on the left, has a first testing contact 111 and a second testing contact 112 on its top side surface. The second tester 12, arranged on the right, has a third testing contact 121 and a fourth testing contact 122 on its top side.

FIG. 1 shows a first electronic component 13, a second electronic component 14 and a third electronic component 15, which are brought to the testers 11 and 12 and moved on further by means of a conveyer belt (not shown). In this case, the testing contacts 111, 112, 121 and 122 are automatically connected to the external contacts of the electronic components 13–15.

The testers 11 and 12 are able to check the electronic components 13–15 with regard to their functionality on the basis of a multiplicity of test criteria. The functions of the testers 11 and 12 include impressing voltages and measuring currents, impressing currents and measuring voltages, measuring resistances or other electrical parameters and interchanging polarities. In the present exemplary embodiment, the testers 11 and 12 operate synchronously, i.e., they detect and check test criteria and parameters of successive electronic components simultaneously.

In one embodiment of the test device, there is provided a control device that is connected to the first tester, the second tester, and the conveying device and which controls these.

With the aid of the control device, the test device can be adapted to the tests that are respectively to be performed, as described below. Test programs to be performed by the first and second testers can be selected and altered. Furthermore, the speed and thus the cycle time of the conveying device can be set precisely to the test programs of the testers that are respectively to be performed.

Figure 2A:
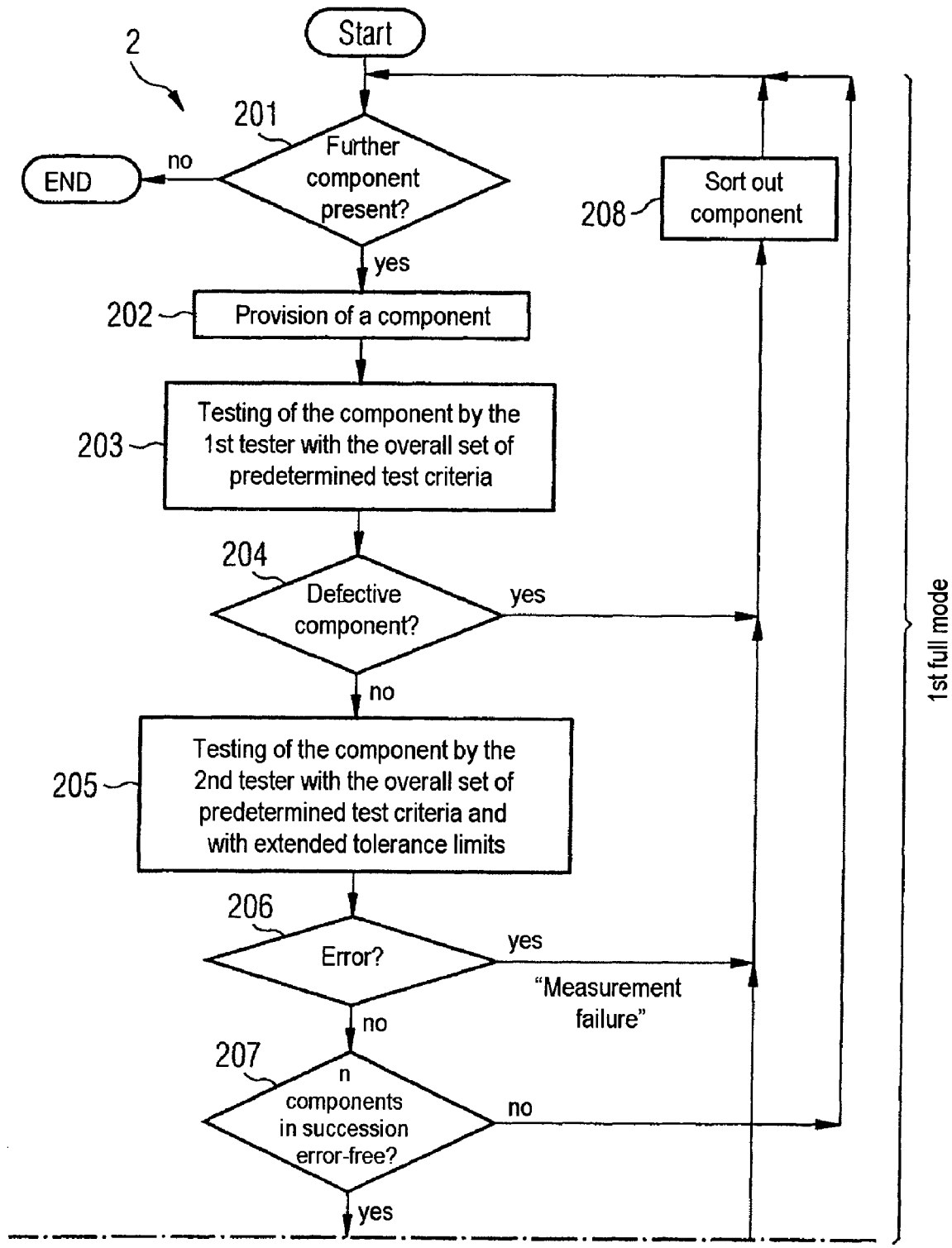

FIG. 2 shows a flow diagram 2 for illustrating the test method according to the invention. The flow diagram 2 has one "start" field, three "end" fields, a multiplicity of execution fields illustrated in rectangular fashion, and a multiplicity of decision fields illustrated in rhomboidal fashion. The method according to the invention is subdivided into a first full mode, into a split mode and into a second full mode. A set, in particular a production batch, of electronic components of identical type is processed according to the method of the exemplary embodiment.

The first full mode is performed at the beginning of the method according to the exemplary embodiment of the invention. In the decision field 201, a check is made to determine whether all the electronic components of the batch have already been tested. If this is the case, then the method according to the invention is ended at this point. If this is not the case, then the method continues with the execution field 202 in the case of which an electronic component that has not yet been tested is selected from the batch and provided. In the execution field 203, this component is checked by the first tester 11 with the overall set of test criteria.

In the decision field 204, an interrogation is effected to determine whether an error was found during this test. If so, then the method continues with the decision field 208, in which the defective component is sorted out, and then continues with the decision field 201. If no error is found during the checking, then the method continues with the execution field 205, in which the component is tested by the second tester 12 with the overall set of the predetermined test criteria, although with extended tolerance limits.

In the decision field 206 that then follows, an interrogation is effected to determine whether an error was found at the second tester 12. If so, then a measurement failure is present. In this case, the method likewise branches to the method step 208, in which the component is sorted out. If no error is found by the second tester 12 during this test, then there follows in the decision field 207, the interrogation to determine whether n error-free components in succession have been checked. In this case, a user-defined value can be predetermined for the variable n.

If n error-free components in succession have not yet been checked, then the first full mode is continued with the decision field 201. If n error-free components in succession have already been checked, then the first full mode is thus ended and the method according to the invention is continued with the split mode.

The split mode begins with the decision field 301, where a check is first made to determine whether components that are still to be tested are present. If not, the method according to the invention is ended at this point. If so, then in the next execution field 302 a further electronic component that has not yet been tested is selected from the batch and provided.

This component is then tested by the first tester 11 in the execution field 303. In this case, a first subset of the overall set of predetermined test criteria is checked. In the subsequent decision field 304, an interrogation is effected to determine whether a defective component has been found during this test. If so, then the method branches to the method step 308, in which the component is sorted out, and the method is thereupon continued with the decision field 301 in the split mode. If no error is found by the first tester 11, then in the next execution field 305, the component is checked by the second tester 12 on the basis of a second subset of the overall set of predetermined test criteria. An interrogation is subsequently effected in the decision field 306 to determine whether a defective component was found in the process. If so, then the component is sorted out in accordance with the method step 308 and the method is continued with the decision field 301 in the split mode. If no error is found for the tested component during the test by the second tester 12, then a check is made in the subsequent decision field 307 to determine whether k components have already been tested in the split mode. If not, then the method continues with the method step 301. If so, then the split mode is ended at this point and the method continues with the second full mode.

At the beginning of the second full mode, a check is made in the decision field 401 to determine whether a further component that has not been tested is still present. If not, then the method according to the invention is ended at this point. If so, then a further component is selected and provided in the execution field 402. This component is tested by the first tester 11 in the next decision field 403, the overall set of predetermined test criteria once again being taken as a basis.

An interrogation is thereupon effected in the subsequent decision field 404 to determine whether a defective component has been found during this check. If so, then the relevant component is sorted out in the subsequent method step 408 and the method according to the invention is continued with the decision field 401 in the second full mode. If not, the component is tested by the second tester 12 in the next execution field 405. In this case, the same test criteria as in the checking in method step 403, but with extended tolerance limits, are taken as a basis.

In the decision field 406, that then follows, an interrogation is effected to determine whether an error was found during this checking by the second tester 12. If so, then a measurement failure is present. In this case, the relevant component is sorted out in accordance with method step 208, and the method is continued in the first full mode. If no error is found during the checking by the second tester 12, then the method continues with the decision field 407, in the case of which an interrogation is effected to determine whether m error-free components in succession have already been checked in the second full mode. If not, then the second full mode is repeated beginning with the method step 401. If m error-free components in succession have already been found in the second full mode, then the method according to the invention is continued in the split mode beginning with the method step 301.

The values for the variables n, k and m can be prescribed by a user. It is thereby possible to set how many repetitions the first full mode, the split mode, and the second full mode respectively provide. The test criteria are likewise prescribed in a user-defined manner. The number of test criteria required for testing electronic components often increases proportionally with the complexity thereof. For complicated transistors it is possible in this case to test a multiplicity of test criteria.

In the first and in the second full mode, all of the test criteria are tested in a redundant manner by two testers 11 and 12 arranged successively, thus resulting in a very reliable but time-intensive checking. In the split mode, all of the test criteria are divided between the two testers 11 and 12, as a result of which a redundancy is avoided and it is simultaneously ensured that each test criterion is tested at least once. In this case, the split mode operates particularly optimally with respect to speed. The fact that the split mode is preceded by the first full mode has the effect that a transition is made to the split mode only when a specific number of electronic components have been tested without errors. The interposition of the second full mode into the split mode ensures that a double 100% testing is regularly effected by the two testers 11 and 12, by which the accuracy of the test results can be monitored. Errors during the operation of the testers are thereby reliably avoided. If errors are found at the second test system in the second full mode, then the method automatically continues with the more comprehensive first full mode.

The test method according to the invention is explained in more detail below on the basis of exemplary embodiments with reference to FIGS. 1 and 2. The electronic components under consideration in this case are diodes of the type BAV 99, that have been produced in the same production installation or production line. The batch size is x=30, and for illustrative reasons, the values n=10, k=10 and m=1 are prescribed for the variables n, k and m in the subsequent exemplary embodiment. In a test performed in reality, the variables n, k and m may assume, e.g., the values n=500, k=100 and m=1. It will be understood, however, that the invention is not limited to any particular values for these variables.

The test criteria comprise the measurement of the forward voltage and also the measurement of a reverse current 1 and of a reverse current 2 in the components under consideration. The forward voltage and the reverse current are characteristic electrical parameters of a diode.

A time window of 5 ms is provided for the measurement of the forward voltage. In this case, via the testing contacts 111 and 112 of the first tester 11 and via the testing contacts 121 and 122 of the second tester 12, a forward current IF=10 mA is applied to the electronic components and the voltage drop generated thereby is measured. The forward voltage UF measured in the electronic components by the first tester 11 must be less than 820 mV, and the forward voltage UF measured by the second tester 12 must be less than 855 mV.

The measurement of the reverse current 1 and of the reverse current 2 requires a time window of 20 ms in each case, in total 40 ms. In this case, the testing contacts 111 and 112 of the first tester 11 and also the testing contacts 121 and 122 of the second tester 12 are polarized such that the diode is turned off. A reverse voltage UR=70 V is then impressed and the reverse current generated thereby is measured. The reverse current IR measured in the electronic components by the first tester 11 must be less than 100 nA, and the reverse current IR measured by the second tester 12 must be less than 150 nA.

In the first and in the second full mode, the measurement time of 45 ms for checking the components results from the sum of the maximum time windows for the measurement of the forward voltage, of the reverse current 1 and of the reverse current 2.

In the split mode, the measurement of these parameters is divided between the first tester 11 and the second tester 12 in such a way that the forward voltage and also the reverse current 1 are measured at the first tester 11 and only the reverse current 2 is measured at the second tester 12. The measurement time in the split mode accordingly results as 25 ms.

In a first example, all x=30 electronic components of the batch under consideration are error-free. The method according to the invention is first performed in the first full mode. In this case, for the first electronic component 13, for the second electronic component 14, for the third electronic component 15 and for seven further electronic components (a total of ten) the forward voltage, the reverse current 1 and the reverse current 2 are successively measured at the first tester 11 and with extended tolerance limits at the second tester 12, no errors being detected by the testers 11 and 12. It is then found in the method step 207 of the flow diagram 2 that ten error-free components in succession have been checked.

The method according to the invention is accordingly continued with the split mode. In this case, the first tester 11 checks the forward voltage and the reverse current 1 and the second tester 12 checks the reverse current 2 of the further electronic components. This split mode is carried out successively for the components 11–20 until it is found in the method step 307 of the flow diagram 2 that ten error-free components in succession have been checked in the split mode, whereupon a changeover is made to the second full mode.

This second full mode is performed only for the 21st component. In this full mode, the forward voltage, the reverse current 1 and the reverse current 2 are in each case checked by the first tester 11 and with extended tolerance limits by the second tester 12. No errors result in this case. Therefore, in accordance with the method step 407, the method switches back to the split mode, in which the error-free electronic components 22–30 are successively tested. After running through the split mode for the 30th electronic component of the batch under consideration, it is found in the method step 301 in accordance with FIG. 2 that there are no further components present in the batch under consideration. The method according to the invention is thus ended.

In the second example, the fifth electronic component in the batch under consideration is defective. The method according to the invention again begins in the first full mode. In the case of the fifth electronic component, the check in accordance with method step 204 reveals an error, since the first tester 11 finds an erroneous forward voltage, an erroneous reverse current 1 and also an erroneous reverse current 2 for the fifth electronic component under consideration. The fifth electronic component is thereupon sorted out in accordance with method step 208. The following error-free electronic components 6–15 are likewise tested in the first full mode. The method according to the invention is then performed for the electronic components 16–25 in the split mode. The second full mode is performed for the 26th electronic component and then the method switches back to the split mode again, in which the electronic components 27–30 are tested. It is then found in the method step 301 that the entire batch has been tested. The method according to the invention is finished at this point.

In the third example, the fifteenth electronic component of the batch under consideration is defective. In this case, the first full mode is performed for the electronic components 1–10. A changeover is then made to the split mode, which is performed for the electronic components 11–20. The checking of the 15th electronic component by the first tester 11 in accordance with the method steps 303 and 304 reveals an erroneous forward voltage and also an erroneous reverse current 1 of the 15th electronic component which is thereupon sorted out in accordance with the method step 308. After performing the split mode for the electronic components 11–20, the second full mode is performed for the 21st electronic component. The method then switches back to the split mode again, in which the electronic components 22–30 are tested. In the method step 301, it is finally found that the entire batch has been tested. The method according to the invention is ended here.

In the case of a fourth example, a functional disturbance occurs in the second tester 12 starting from the 18th electronic component. This functional disturbance consists of the forward voltage being measured incorrectly by the second tester 12.

The error-free electronic components 1–10 are checked in the first full mode. The method according to the invention is subsequently continued in the split mode. The error-free electronic components 11–17 are tested correctly by the first tester 11 and by the second tester 12. The functional disturbance of the second tester 12 that occurs starting from the 18th electronic component is not identified in the split mode because, in the split mode, the second tester 12 measures only the reverse current 2 and not the forward voltage. Accordingly, the electronic components 18, 19 and 20 are also checked correctly in the split mode. In the case of the 21st tested electronic component, which is tested in the second full mode, the measurement failure of the second tester 12 is noted in the method step 406. The 21st electronic component is thereupon sorted out and the method is continued in the first full mode. For the error-free electronic components 22–30, too, the second tester 12 detects an erroneous forward voltage in each case in the method steps 205 and 206 of the flow diagram 2. The inherently error-free electronic components 22–30 are therefore sorted out. Once all the electronic components of the batch under consideration have been tested, the method according to the invention is ended in accordance with the decision field 201.

By virtue of the fact that the erroneous forward voltage for the electronic components 21–30 has always been found by the second tester 12, but not by the first tester 11, which, after all, operates with the same test criteria as the second tester 12, the user acquires the indication that either the first tester 11 or the second tester 12 has a functional disturbance or a defect.

The controlled interposition of the split mode in the method according to the invention results in a significant acceleration of the test method. The regular changeover from the split mode to the second full mode ensures a double 100% testing of the predetermined test criteria by the two testers 11 and 12 involved, with the result that defective components and also functional disturbances or defects of the testers are noted contemporaneously and reliably.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for testing electronic components, in which electronic components of a set are supplied in sequence for testing to first and second testers in series, the method comprising:
   a) performing testing in a first full mode comprising:
      a1) selecting an electronic component that is next in the sequence;
      a2) testing the electronic component with the first tester using a predetermined set of test criteria and sorting out the electronic component if an error is found;
      a3) if no error is found by the first tester, testing the electronic component with the second tester using the predetermined set of test criteria and sorting out the electronic component if an error is found; and
      a4) repeating a1) to a3) until no errors are found for a predetermined number of electronic components in succession; and
   b) if a) is completed before testing all of the electronic components in the set, performing testing in a split mode comprising:
      b1) selecting an electronic component that is next in the sequence;
      b2) testing the electronic component with the first tester using a first subset of the predetermined set of test criteria and sorting out the electronic component if an error is found; and
      b3) if no error is found by the first tester, testing the electronic component with the second tester using a second subset of the predetermined set of test criteria and sorting out the electronic component if an error is found; and
      b4) repeating b1) to b3) for subsequent electronic components in the sequence.

2. The method of claim 1, wherein the first full mode and/or the split mode are repeated in a looplike manner until all of the electronic components have been checked.

3. The method of claim 1, wherein the split mode is repeated until a predetermined number of error-free electronic components have been tested, the method further comprising:
   c) if b) is completed before testing all of the electronic components in the set, performing testing in a second full mode comprising:
      c1) selecting an electronic component that is next in the sequence;
      c2) testing the electronic component with the first tester using the predetermined set of test criteria and sorting out the electronic component if an error is found;
      c3) if no error is found by the first tester, testing the electronic component with the second tester using the predetermined set of test criteria and sorting out the electronic component and returning to the first full mode if an error is found; and
      c4) repeating c1) to c3) until an error is found in c3) or a predetermined number of error-free electronic components have been tested.

4. The method of claim 3, wherein the method returns to the split mode in response to the predetermined number of error-free electronic components being found in the second full mode.

5. The method of claim 1, wherein the first and second subsets of the predetermined set of test criteria are disjoint.

6. The method of claim 3, wherein testing of the electronic component in a3) and c3) with the second tester is performed with extended tolerance limits in comparison with the testing performed in a2) and c2) with the first tester.

7. The method of claim 1, wherein the predetermined set of test criteria comprise predetermined values for input voltages and/or input currents to be applied to the electronic component, predetermined desired values and tolerance ranges for voltages present in the electronic component, including forward voltages and/or currents, reverse currents, and/or resistances, and/or defined time intervals.

8. The method of claim 1, wherein the first tester and the second tester have testing contacts that are connected to the external contacts of the electronic component in an automated manner prior to testing each the electronic component and are disconnected from the external contacts of the electronic component in an automated manner after testing.

9. The method of claim 8, further comprising providing a conveying device that moves the electronic components to the first tester and to the second tester in an automated manner.

10. The method of claim 9, further comprising providing a control system that is connected to the first tester, the second tester, and the conveying device.

11. A computer-readable medium storing instructions that, when executed by a processor, cause a testing device to perform the method of claim 1.

* * * * *